United States Patent [19]

Martens et al.

[11] Patent Number: 5,440,238

[45] Date of Patent: Aug. 8, 1995

[54] SURFACE PROPERTY DETECTION APPARATUS AND METHOD

[75] Inventors: Jon S. Martens, Albuquerque, N. Mex.; David S. Ginley, Evergreen, Colo.; Vincent M. Hietala, Placitas; Neil R. Sorensen, Albuquerque, both of N. Mex.

[73] Assignee: Sandia Corporation, Albuquerque, N. Mex.

[21] Appl. No.: 948,535

[22] Filed: Sep. 21, 1992

Related U.S. Application Data

[63] Continuation-in-part of Ser. No. 789,225, Nov. 7, 1991, Pat. No. 5,239,269.

[51] Int. Cl.$^6$ .......................................... G01N 22/00
[52] U.S. Cl. ............................... 324/636; 324/642; 324/644; 324/632; 117/201; 118/712
[58] Field of Search ............... 324/644, 632, 633, 636, 324/635, 642; 117/201; 118/712

[56] References Cited

U.S. PATENT DOCUMENTS

| | | |
|---|---|---|
| 4,800,165 | 1/1989 | Tomoki et al. |
| 4,873,444 | 10/1989 | Cooke et al. |
| 5,072,172 | 12/1991 | Stolarczyk ................... 324/635 |
| 5,103,182 | 4/1992 | Moslehi ........................ 324/644 |
| 5,105,157 | 4/1992 | Schmitt ......................... 324/644 |
| 5,216,372 | 6/1993 | Zoughi .......................... 324/644 |
| 5,239,269 | 8/1993 | Martens ........................ 324/633 |
| 5,241,279 | 8/1993 | Boniort ......................... 324/635 |

OTHER PUBLICATIONS

"Confocal Resonators for Measuring the Surface Resistance of High-temperature Superconducting Films" by J. S. Martens, et al., *Appl. Phys. Lett.* vol. 58, pp. 2543–2545 (1991).

"Morphology Control and High Critical Currents in Superconducting Thin Films in the Tl-Ca-Ba-Cu-O System" by D. S. Ginley, et al., *Physica C*, vol. 160 pp. 42–48 (1989).

"The Role of Low Temperatures in the Operation of Logic Circuitry" by R. W. Keyes, et al., *Proceedings of the IEEE*, vol. 58 pp. 1914–1922 (1970).

"The Effects of Processing Sequences on the Microwave Surface Resistance of TlCaBaCuO" by J. S. Martens, et al., *J. Appl. Phys.* vol. 69, pp. 8268–8271 (1991).

"Hydrogen Plasma Treatment of Silicon Surfaces Studies by In-Situ Spectroscopic Ellipsometry" by P. Raynaud, *Applied Surface Science*, vol. 46, pp. 435–440 (1990).

"Penetration of Electromagnetic Fields into a Good Conductor" by S. Ramo, et al., *Fields and Waves in Communications Electronics*, pp. 147–151 (1984).

"Infrared and Optical Masers" by A. L. Schawlow, et al., *Physical Revie*, vol. 112, pp. 1940–1949 (1958).

"On the Focused Fabry-Perot Resonator in Plasma Diagnostics" by K. E. Lonngren, et al., *IEEE Transactions on Microwave Theory and Techniques* vol. 58, pp. 548–549 (1964).

"Microwave Surface Resistance of YBa2CU3)6.9 Superconducting Films" by J. S. Martens, et al., *Appl. Phys. Lett*, vol. 52, pp. 1822–1824 (1988).

*Primary Examiner*—Kenneth A. Wieder
*Assistant Examiner*—Jose M. Solis
*Attorney, Agent, or Firm*—George H. Libman; Timothy D. Stanley

[57] ABSTRACT

Apparatus and method for detecting, determining, and imaging surface resistance corrosion, thin film growth, and oxide formation on the surface of conductors or other electrical surface modification. The invention comprises a modified confocal resonator structure with the sample remote from the radiating mirror. Surface resistance is determined by analyzing and imaging reflected microwaves; imaging reveals anomalies due to surface impurities, non-stoichiometry, and the like, in the surface of the superconductor, conductor, dielectric, or semiconductor.

3 Claims, 4 Drawing Sheets

SURFACE PROPERTY DETECTION APPARATUS AND METHOD

GOVERNMENT RIGHTS

The U.S. Government has rights in this invention pursuant to Contract DE-AC04-76DP00789 between the Department of Energy and American Telephone and Telegraph Company.

CROSS-REFERENCE TO RELATED APPLICATIONS

This application is a continuation-in-part application of U.S. patent application Ser. No. 07/789,225, filed Nov. 7, 1991, (now U.S. Pat. No. 5,239,269, issued Aug. 24, 1993), entitled *Apparatus and Method for Measuring and Imaging Surface Resistance*, the teachings of which are incorporated by reference herein.

BACKGROUND OF THE INVENTION

1. Field of the Invention (Technical Field)

The present invention relates to apparatus for measuring, detecting, and imaging surface properties, for example, surface resistance and corrosion in various materials, including superconductors and normal conductors; and a method of using the apparatus.

2. Background Art

As disclosed in U.S. Pat. No. 5,239,269, and the publication entitled "Confocal Resonators for Measuring the Surface Resistance of High Temperature Superconducting Films," by J. S. Martens, V. M. Hietala, D. S. Ginley, T. E. Zipperian, and G. K. G. Hohenwarter, *Appl. Phys. Lett.*, Vol. 58, p. 2543 (Jun. 3, 1991), the advent of numerous new, relatively high critical temperature, superconducting alloys and materials has brought with it a commensurate need to measure various properties of such materials, such as surface resistance and consistency. For example, U.S. Pat. No. 4,873,444, entitled *Detection of Surface Impurity Phases in High-Tc Superconductors Using Thermally Stimulated Luminescence*, to Cooke, et al., discloses a process of detecting surface impurities by irradiating a sample with ionizing radiation, heating the irradiated sample to luminescence, and comparing the integrated luminescence with a calibration curve to determine surface resistance. This process, however, necessarily suffers from the disadvantage of testing the samples under normal conducting states, rather than under operational superconducting states.

"Morphology Control and High Critical Currents in Superconducting Thin Films in the Tl—Ca—Ba—Cu—O System," by D. S. Ginley, et al., Physica C, Vol. 160, pp. 42–48 (1989), discusses superconducting polycrystalline thin films in the Tl—Ca—Ba—Cu—O system with extremely high transition temperatures.

R. W. Keyes, et al., discuss the suggested advantages and possible disadvantages of operative logic circuitry at low temperatures in "The Role of Low Temperatures in the Operation of Logic Circuitry," *Proceedings of the IEEE*, Vol. 58, No. 12, pp. 1914–1932 (December 1970).

A. L. Schawlow, et al., in "Infrared and Optical Masers," *Physical Review*, Vol. 112, Number 6, pp. 1940–1949 (December 1958), discuss maser oscillation using resonant cavities of microwave dimensions.

K. E. Lonngren, et al., in an article entitled "On the Focused Fabry-Perot Resonator in Plasma Diagnostics," appearing in *IEEE Transactions on Microwave Theory and Techniques*, Vol. MTT-12, pp. 548–549 (1964), discuss plasma diagnostics using a Fabry-Perot resonator at frequencies lower than microwave frequencies.

Wavemeter cavities for measuring surface resistance of superconductors are also known in the prior art, as disclosed in "Microwave Surface Resistance of $YBa_2Cu_3O_{6.9}$ Superconducting Films," *Appl. Phys. Lett.*, Vol. 52, No. 21, 23 pp. 1822–1824 (May 1988). While this process permits surface resistance measurement under superconducting conditions, the sample must be in contact with the cavity itself, complicating the measurement process and requiring additional energy to maintain cryogenic conditions.

Confocal resonators, that is, resonators comprising two spherical mirrors with the center of curvature of each mirror at the other spherical surface, are also known in the prior art. Such resonators are known in the prior art, for example, for measuring dielectric constants of various insulating materials. "The Effects of Processing Sequences on the Microwave Surface Resistance of TlCaBaCuO", by J. S. Martens, T. E. Zipperian, D. S. Ginley, V. M. Hietala, C. P. Tigges, and T. A. Plut, *J. Appl. Phys.*, Vol. 69, p. 8268 (Jun. 15, 1991), discloses the effects of various typical processing techniques on the surface resistance of TlCaBaCuO supercooling thin films.

It is also desirable to detect corrosion and/or thin layer growth or removal on conductors at an early state (before such are visible) for an understanding of these processes and for optimizing corrosion resistance and material modification. The development of such a technique allows repairs or structural analysis to take place before the damage is catastrophic. Further, such a technique will provide a powerful probe of the kinetics and thermodynamics of the growth or etching process. Structures on which this technique could be used include any conductor where the corrosion or thin film growth has some real component of conductivity. Materials of interest include, for example, circuit board metallizations, structural members in aircraft and other assemblies, and microelectronic pad structures. Of particular interest are the degradation mechanisms in the high temperature superconducting (HTS) ceramic oxides in which the surface chemistry is very complicated. A simple corrosion detection technique would also be useful in evaluating the effects of various chemicals on material surfaces.

Currently, the analysis of corrosion and many thin film growth processes relies on electrochemical or optical probing of the interface. Electrochemical techniques, such as disclosed in U.S. Pat. No. 4,800,165, to Tomoki Oka, et al., entitled *Method of Detecting Corrosion Rate of Member of Steel Material*, are invasive, requiring contact to the sample and the use of an electrolyte. They are predominantly measurements of the cell potential, capacitance, or photoelectrochemical behavior. In situ diagnostics are not possible in the majority of the electrochemical methods, and the analysis of the surfaces of large objects, such as aircraft or boats is not possible. Optical techniques can be employed in situ, but with the exception of a few approaches, such as electroreflectance and ellipsometry, such as disclosed in "Hydrogen Plasma Treatment of Silicon Surfaces Studied by In-Situ Spectroscopic Ellipsometry," by P. Raynaud, J. P. Booth, and C. Pomot, *Applied Surface Science*, Vol. 46, pp. 435–440, (1990), they cannot be used on the thin initial layer due to insufficient absorption. Also, in many cases, the active chemical environment during corrosion or thin film growth processes precludes the use of optical probes. Other techniques such as surface analytical methods typically require high vacuum and cannot be used in situ or as a probe of process thermodynamics or kinetics. None of these approaches provide a rapid, non-invasive technique for sample characterization.

The confocal resonator technique can be used ex situ or in situ to probe any layer which changes the surface resistance of the sample. Since it can look through a window or be used in air, a wide range of applications is possible. Its portability means it can be used to scan large, irregular surfaces. The confocal technique is nondestructive and requires no special samples.

SUMMARY OF THE INVENTION
(DISCLOSURE OF THE INVENTION)

The present invention is directed to methods for detecting, determining, and imaging various surface properties of a sample, including, for example, thin film growth, corrosion, etching behavior, and oxide formation.

The invention comprises the steps of: generating electromagnetic radiation in the frequency range of $10^9$ to $10^{12}$ Hz; radiating the electromagnetic radiation; reflecting the radiated electromagnetic radiation from the remote sample; and detecting surface properties on the remote conductor sample from the reflected electromagnetic radiation. The remote sample may be a conductor (including a normal conductor such as an iron film or a copper conductor), a superconductor, a semiconductor, or a dielectric. In the preferred embodiment, corrosion is detected by determining and imaging the surface resistance of the remote conductor sample from the reflected electromagnetic radiation. The surface property detected is on the order of magnitude of the depth of penetration given by:

$$\delta = \sqrt{\frac{2}{\omega \mu_0 \sigma}},$$

where $\delta$ is the depth of penetration, $\omega$ is the test frequency function, $\mu_0$ is the permeability of free space, and $\sigma$ is the conductivity of the remote sample. Properties which may be detected include conductivity, thin film growth, etching behavior, and oxide formation.

A primary object of the invention is the provision of a noninvasive technique for early detection and measurement of corrosion.

A further object of the invention is the provision of an in situ or ex situ method of corrosion measurement.

Yet another object of the invention is the provision of an apparatus for measuring surface properties of a sample through a window in a corrosive environment.

An advantage of the invention is that the sample does not need to be patterned, as with transmission line measurement techniques.

Another advantage of the invention is that there is no upper limit on sample size.

Yet another advantage of the invention is that the sample is remote from the measurement apparatus.

Still another advantage of the invention is the early and rapid detection of corrosion on both regular and irregular surfaced conductors.

A further advantage of the invention is the provision of a sensitive, convenient and universal detection method for detecting corrosion, thin film growth, etching behavior, and oxide formation.

Another advantage of the invention is the portability and ease of positioning the apparatus relative to the sample.

Other objects, advantages, and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention.

DESCRIPTION OF THE PREFERRED EMBODIMENTS
(BEST MODES FOR CARRYING OUT THE INVENTION)

The present invention is of methods and apparatuses for detecting, determining, and imaging various surface properties of a sample, including, for example, thin film growth, corrosion, etching behavior, and oxide formation.

Figure 1:
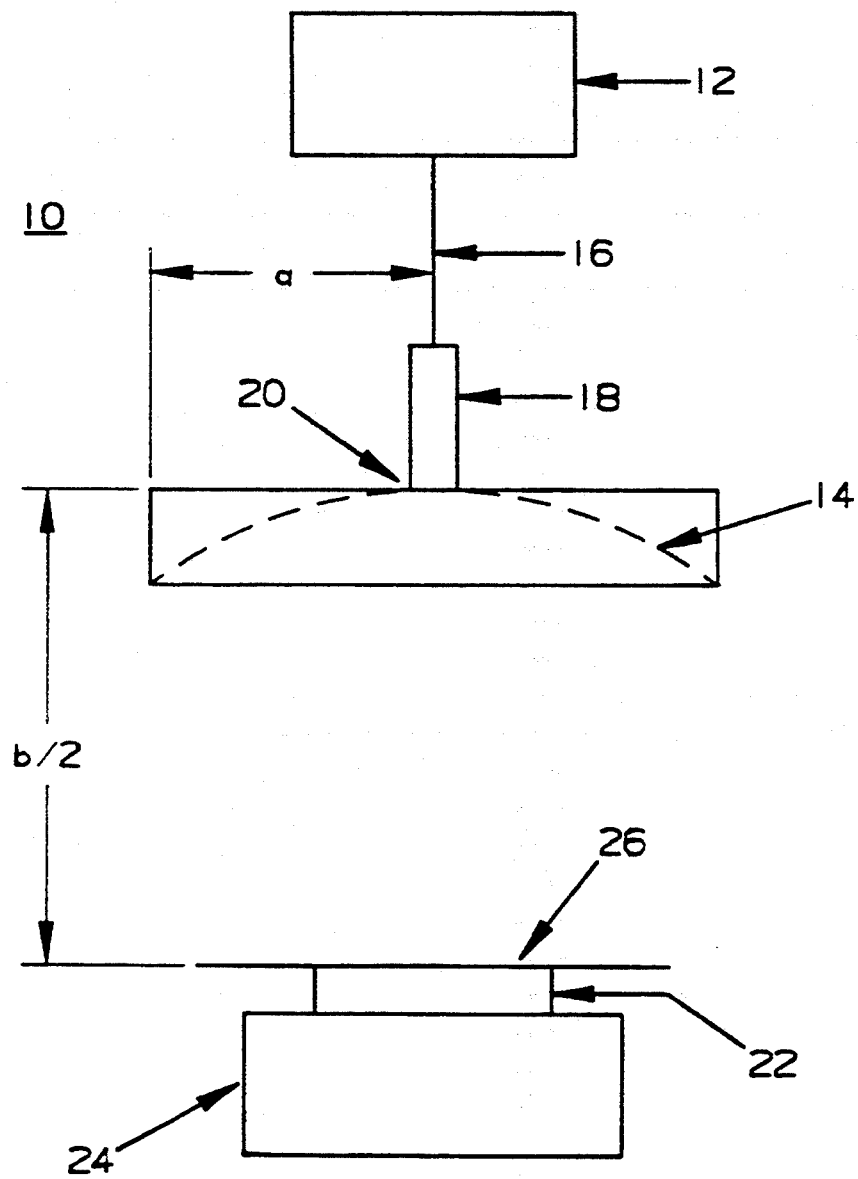
FIG. 1 schematically depicts the preferred apparatus of the invention.

FIG. 1 schematically depicts the preferred apparatus 10 of the invention. As shown therein, apparatus 10 comprises network analyzer and image processor 12, comprising a microwave/millimeter wave tunable source, directional couplers, detector, and voltmeter; for example, a Hewlett Packard 8510, which in turn comprises a microwave frequency source ($10^9$ to $10^{12}$ Hz), e.g., a Hewlett Packard 8340, detectors, couplers, and voltmeters. Microwave energy, both incident and reflected, is coupled to concave (spherical) mirror 14 by coaxial cable 16 and waveguide 18 through excitation port 20. Mirror 14 may comprise, for example, normal conducting metals such as aluminum, silver, copper, and the like, as well as superconducting materials. Even semiconductors may be used under some circumstances.

Classic confocal resonator structure comprises two concave mirrors with the center curvature of each mirror at the concave surface of the other mirror (for example, a radius of curvature b). As shown in FIG. 1, this resonator structure has been modified such that the sample 22 is at a distance of half the standard radius of curvature of concave mirror 14. This modified resonator structure provides the advantage of permitting testing of remote sample 22 under a variety of conditions, while the testing equipment itself can remain at an ambient environment.

Further, this modified structure ensures that electromagnetic waves arriving at the sample 22 are nearly planar; the magnetic field is at maximum at the sample resulting in increased sensitivity, since losses are concentrated in the sample, not in the mirror.

Sample analysis assumes that the dimensions of mirror 14 (a=mirror radius; b=radius of curvature) greatly exceed free space wavelength ($\gamma$), and that the sample 22 (or sample+base plate 26, needed for smaller samples) exceeds the spot size $$\left(\text{spot size} = \sqrt{\frac{b\lambda}{(2\pi)}}\right)$$

of the Gaussian beam.

The surface resistance of the sample is computed as set forth in parent U.S. Pat. No. 5,239,269, col. 4, lines 25–44, which is hereby incorporated by reference.

Figure 2:
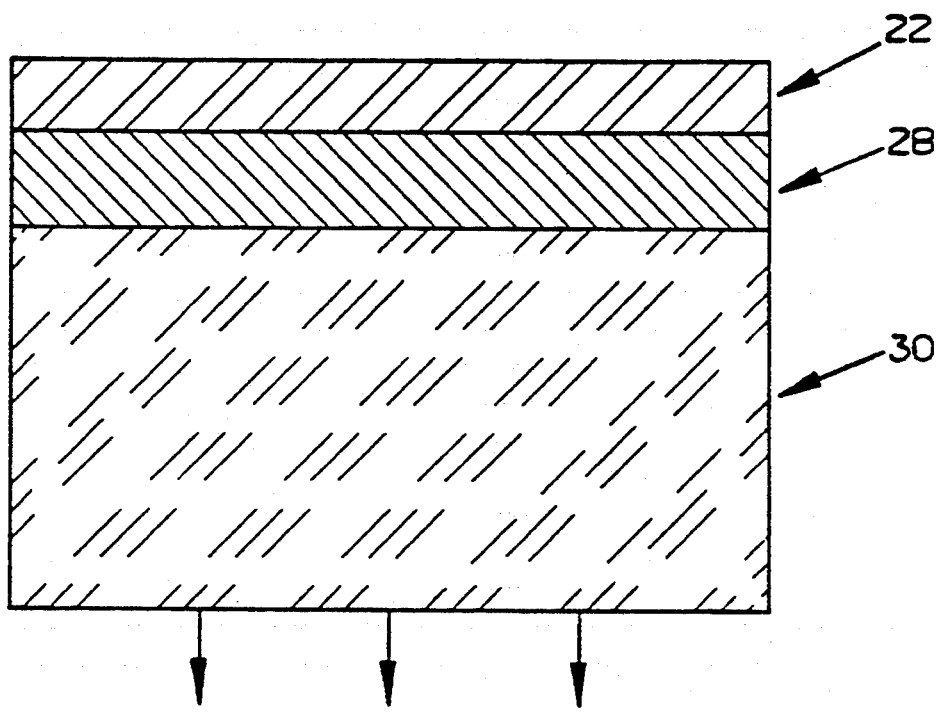
FIG. 2 shows the sample and sample holder of the invention.

Sample holder 24, as depicted in FIGS. 1 and 2, comprises a post 30 of copper, aluminum or other normal or superconducting conductor. Post 30 of copper or other normal metal is provided with superconducting equipment, for example, baths or conduits of liquid He or $N_2$, cryostat structure, Dewar flask structure, or the like. A thin film high $T_c$ superconductor sample 22 to be tested is grown upon a substrate 28 held by the sample holder 24. If a bulk sample is to be tested, it is mounted directly on the sample holder, and no substrate is utilized.

Surface resistance is defined as the real part of the ratio of electric to magnetic field amplitude at the surface when an electromagnetic field is applied. The surface resistance is a sensitive measure of the conductivity and field integrity of the material at the surface. Changes in surface layer conduction properties can be sensitively measured by the surface resistance using Eq. 1a, of the parent patent since at high frequencies (such as those used by the confocal technique), electromagnetic fields are confined to a thin layer on the metal surface. The thickness of this layer for normal metals is the skin depth ($\delta$), or depth of penetration, and is given by:

$$\delta = \sqrt{\frac{2}{\omega\mu_0\sigma}}, \quad (4)$$

where $\omega$ is the test frequency function ($2\pi f_0$), $\mu_0$ is the permeability of free space ($4\pi 10^{-7}$ H/m) and $\sigma$ is the conductivity of the material under test. See, e.g., S. Ramo, et al., *Fields and Waves in Communications Electronics*, Wiley: New York, pp. 149-51 (2d ed. 1984). For normal metals in the present frequency range of the confocal resonator technique (30-100 GHz), the skin depth will usually be between 0.1 and 1.0 $\mu$m. Since the initial stages of any corrosion or thin film process occurs on this length scale, or order of magnitude, these stages can be detected by a change in the complex permittivity of the altered layer relative to the initial material.

EXAMPLES

The invention is further illustrated by the following non-limiting examples.

EXAMPLE 1

Figure 3:
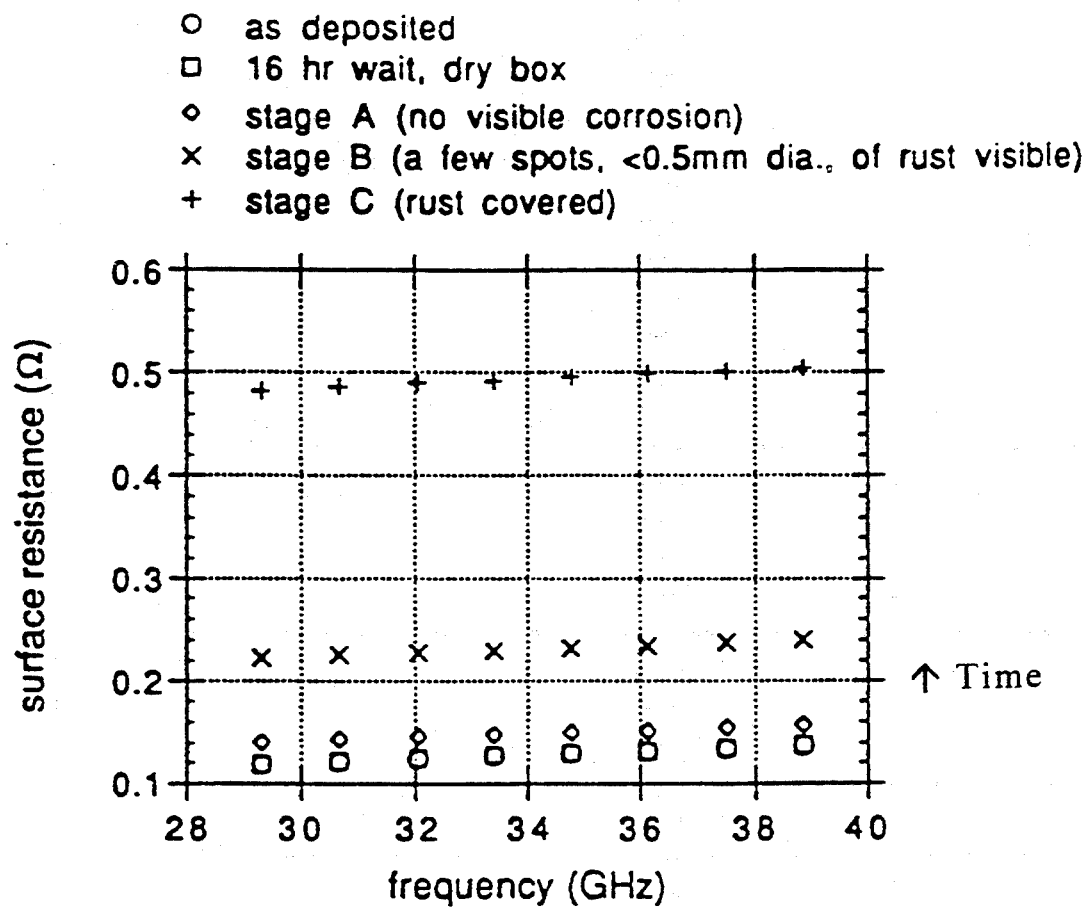
FIG. 3 is a graph showing variation of the surface resistance of an iron film as a function of corrosion time.

An example of the effectiveness of this method in detecting corrosion used an iron film. The film was exposed to a humid atmosphere for a period of days and its surface resistance was periodically measured. The results are shown in FIG. 3 to be an increase in surface resistance as an indication of surface corrosion. Since the measurement resolution was about 3 m$\Omega$ in this case, corrosion was easily detected before it was visible to a microscope-aided eye.

EXAMPLE 2

Figure 4:
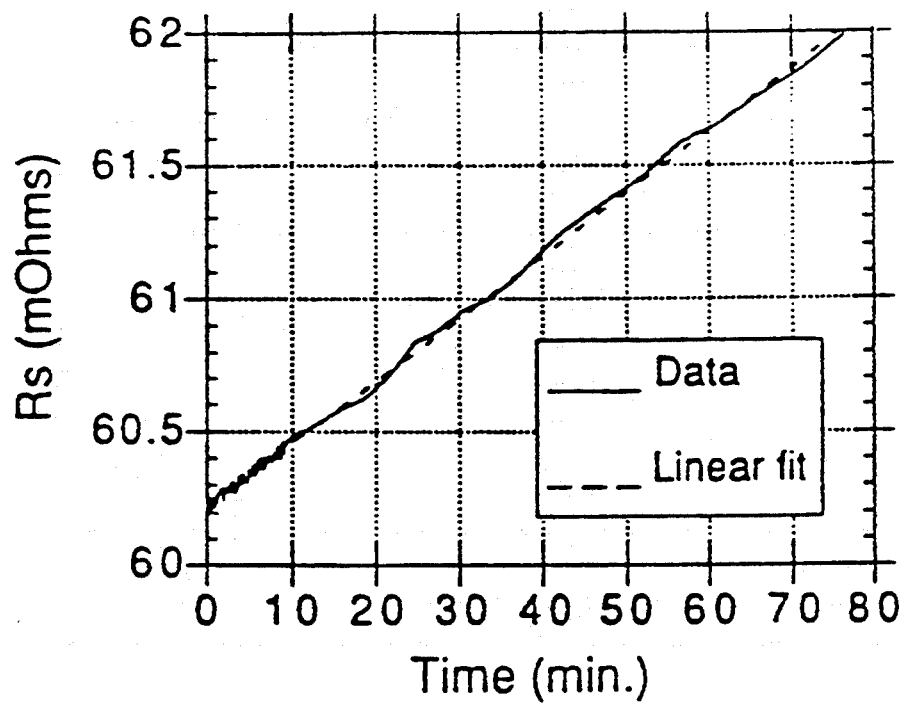
FIG. 4 is a graph depicting variation of surface resistance of a copper film as a function of exposure time to $H_2S$.

Another example investigated the sulfidation of copper. A copper-coated quartz thickness monitor and a Cu film on a sapphire substrate were exposed to a controlled atmosphere of $H_2S$ resulting in $CuS/Cu_2S$ growth on the surface. Measurement was effected through a window looking into the corrosive environment. FIG. 4 shows the changes in surface resistance to be a linear function of exposure time. These results correlate well with the quartz monitor measurement of a linear 6.6 ng/min/cm$^2$ experiment. This again illustrates the adaptability and sensitivity of the technique.

The preceding examples can be repeated with similar success by substituting the generically or specifically described reactants and/or operating conditions of this invention for those used in the preceding examples.

Generally, the apparatus provides more than mere detection of conductor properties in a surface layer of a sample. Changes in film thickness as well as conductivity can be detected and measured. Thus, the apparatus and method can be used to detect, measure, and record thin film growth, etching behavior, corrosion, and oxide formation.

Further, surface properties of materials other than superconductors and conductors can be analyzed. The surface properties of dielectrics and semiconductors can also be analyzed by the apparatus and method of the invention.

Although the invention has been described with reference to these preferred embodiments, other embodiments can achieve the same results. Variations and modifications of the present invention will be obvious to those skilled in the art and it is intended to cover in the appended claims all such modifications and equivalents. The entire disclosures of all patents and publications cited above are hereby incorporated by reference.

What is claimed is:

1. A method for detecting corrosion on the surface of a remote conductive sample, the method comprising the steps of:

forming a modified confocal resonator comprising a reflecting surface spaced from the sample;

generating electromagnetic radiation at the resonant frequency of the resonator in the frequency range of $10^9$ to $10^{12}$ Hz;

detecting changes in the complex permittivity of the surface of the remote conductive sample from the electromagnetic radiation; and detecting the corrosion as a function of the change in complex permittivity, 2. A method for detecting thin film growth on the surface of a remote conductive sample, the method comprising the steps of:

forming a modified confocal resonator comprising a reflecting surface spaced from the sample;

generating electromagnetic radiation at the resonant frequency of the resonator in the frequency range of $10^9$ to $10^{12}$ Hz;

detecting changes in the complex permittivity of the surface of the remote conductive sample from the electromagnetic radiation; and detecting the thin film growth as a function of the changes in complex permittivity.

3. A method for detecting etching behavior on the surface of a remote conductive sample, the method comprising the steps of:

forming a modified confocal resonator comprising a reflecting surface spaced from the sample;

generating electromagnetic radiation at the resonant frequency of the resonator in the frequency range of $10^9$ to $10^{12}$ Hz;

detecting changes in the complex permittivity of the surface of the remote conductive sample from the electromagnetic radiation; and detecting the etching behavior as a function of the changes in complex permittivity.

* * * * *